(12) United States Patent
Dias

(10) Patent No.: US 7,479,909 B2
(45) Date of Patent: Jan. 20, 2009

(54) SUPPRESSION OF EVEN-NUMBERED HARMONIC DISTORTION IN A NON-LINEAR ELEMENT

(75) Inventor: Victor Dias, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 344 days.

(21) Appl. No.: 11/134,666

(22) Filed: May 20, 2005

(65) Prior Publication Data

US 2005/0271119 A1    Dec. 8, 2005

(30) Foreign Application Priority Data

May 25, 2004    (DE)    ........................ 10 2004 025 577

(51) Int. Cl.
  *H03M 1/20*    (2006.01)
(52) U.S. Cl. ...................... 341/131; 341/118
(58) Field of Classification Search ................. 341/131, 341/155, 144, 156, 162, 200, 118
See application file for complete search history.

(56) References Cited

U.S. PATENT DOCUMENTS

| | | | |
|---|---|---|---|
| 4,761,634 A | 8/1988 | Yamaguchi et al. | ... 340/347 AD |
| 4,839,650 A * | 6/1989 | Geen et al. | ................ 341/118 |
| 4,994,804 A * | 2/1991 | Sakaguchi | ................... 341/143 |
| 4,994,805 A * | 2/1991 | Dedic et al. | ................. 341/143 |
| 5,148,163 A * | 9/1992 | Frindle | ........................ 341/131 |
| 5,168,459 A | 12/1992 | Hiller | .................... 364/724.19 |
| 5,187,481 A | 2/1993 | Hiller | ......................... 341/131 |
| 5,493,298 A | 2/1996 | Bartz | .......................... 341/131 |
| 6,201,835 B1 * | 3/2001 | Wang | ......................... 375/247 |
| 6,768,437 B1 * | 7/2004 | Ruotsalainen et al. | ....... 341/143 |
| 7,034,736 B1 * | 4/2006 | Ali | .............................. 341/162 |
| 7,107,175 B2 * | 9/2006 | Maloberti et al. | ........... 702/126 |

OTHER PUBLICATIONS

Cooper, George R., et al., Modern Communications and Spread Spectrum, McGraw-Hill International Editions, 1986, pp. 269-275, Sep. 1, 1985.

Sautter, D., et al., Lexikon Elektronik und Mikroelektronik, 2nd Ed., VDI-Verlag GmbH, 1993, pp. 902-903 (German).

* cited by examiner

*Primary Examiner*—Rexford Barnie
*Assistant Examiner*—Joseph Lauture
(74) *Attorney, Agent, or Firm*—Dickstein Shapiro LLP

(57) ABSTRACT

In a method for suppression of even-numbered harmonic distortion which occurs in a non-linear element 4, a signal x(n) is linked to a pseudo random noise sequence r(n), and is thus spread, before passing through the non-linear element 4. After passing through the non-linear element 4, the signal y*(n) is once again linked to the pseudo random noise sequence r(n). The signal y*(n) is thus despread while, in contrast, even-numbered order harmonic elements are once again spread, and remain as broadband noise.

20 Claims, 1 Drawing Sheet

SUPPRESSION OF EVEN-NUMBERED HARMONIC DISTORTION IN A NON-LINEAR ELEMENT

CROSS-REFERENCE TO RELATED APPLICATION

This application claims priority from German Patent Application No. 10 2004 025 577.6, which was filed on May 25, 2004, and is incorporated herein by reference in its entirety.

TECHNICAL FIELD

The invention relates to a method for suppression of even-numbered harmonic distortion which occurs in a non-linear element when analogue or digital signals pass through.

BACKGROUND

Harmonic distortion represents one of the strongest limiting factors on the behaviour of high-quality, analogue microelectronic circuits and other electronic circuits, such as analogue/digital converters (ADC), digital/analogue converters (DAC), filters, etc. Harmonic distortion generally occurs as a result of interference whose level is dependent on the respective signals. In particular, harmonic distortion occurs as a result of the non-linear behaviour of active electronic components (transistors, amplifiers, etc.) or passive electronic components (resistors, capacitors, etc.).

FIG. 1 schematically illustrates a non-linear element 4 with the analogue or digital input signal $x(t)$ or $x(n)$, respectively, and with the analogue or digital output signal $y(t)$ or $y(n)$, respectively. The image of the analogue input signal $x(t)$ on the analogue output signal $y(t)$ is described by the function f, which can be written as a polynomial in the following form:

$$y(t)=f(x(t))=a_0+a_1 x(t)+a_2 x^2(t)+a_3 x^3(t)+, \quad (1)$$

where $a_0, a_1, a_2, a_3 \ldots$ are constant coefficients. For simplificity, the following text considers third-order polynomials ($a_i=0$ for $i=0, 4, 5, \ldots$) with the above expression ($a_1=1$) being normalized, which does not restrict the general applicability of the analysis. If the input signal is a sinusoidal oscillation in the form $x(t)=\cos(\omega t)$, then Equation (1) results in:

$$y(t) = \frac{1}{2}a_2^2 + \left[1 + \frac{3}{4}a_3^3\right]\cos(\omega t) + \frac{1}{2}a_2^2\cos(2\omega t) + \frac{1}{4}a_3^3\cos(3\omega t), \quad (2)$$

where $\omega$ is the circular frequency of the sinusoidal input signal. In addition to the linear component, the output signal contains a constant offset as well as second and third harmonics. If the polynomial in Equation (1) also takes account of higher-order terms, then the output signal additionally includes the corresponding higher harmonics.

The aim is to minimize the non-linearity of electronic circuits, that is to say the magnitudes of the coefficients of non-linear order $a_2, a_3, \ldots$ One possible way to reduce non-linearities is to use high-linearity components for the design of the electronic circuits, for example high-linearity passive components or high-gain amplifiers together with a feedback mechanism.

Another possible way to minimize the non-linear components in electronic circuits is so-called differential technique. This essentially comprises the design of two parallel, ideally identical, signal paths, one of which processes a signal $x_+(t)$, while the other processes the inverted version of the signal $x_-(t)=-x_+(t)$. The input signal $x(t)$ is formed by the difference between the signals in the two signal paths. Thus, $x(t)=x_+(t)-x_-(t)=2x_+(t)$, that is to say the input signal $x(t)$ corresponds to twice the signal $x_+(t)$ in the positive signal path. Based on the assumption of the non-linear relationship between the input signal and output signal as described in Equation (1) and the simplification $a_0=0$, this results in the output signals in the positive and negative signal paths $y_+(t)$ and $y_-(t)$ respectively being:

$$y_+(t) = a_1 x_+(t) + a_2 x_+^2(t) + a_3 x_+^3(t) + \ldots \quad (3)$$

and $$y_-(t) = +a_1 x_-(t) + a_2 x_-^2(t) + a_3 x_-^3(t) + \ldots \quad (4)$$
$$= -a_1 x_+(t) + a_2 x_+^2(t) - a_3 x_+^3(t) + \ldots$$

The differential output signal $y(t)$ is described by: (5)

$$y(t) = y_+(t) - y_-(t) = 2a_1 x_+(t) + 0 + 2a_3 x_+^3(t) + 0 + \ldots$$

In this case, the even-numbered order terms ($a_2, a_4, \ldots$) cancel one another out. The even-numbered order harmonics of sinusoidal input signals therefore ideally disappear.

This frequently used technique has a number of disadvantages, however:
(1) Odd-numbered harmonics do not cancel one another out.
(2) The cancellation is dependent on matching between the two signal paths. A mismatch of the signals $y_-(t)$ and $y_+(t)$ in the two signal paths leads to incomplete cancellation of equivalent polynomial coefficients of the even-numbered order terms, and the output signal still includes the corresponding even-numbered harmonics.
(3) Differential circuits lead to higher circuit design costs and occupy more space and chip area, since the signal path must be duplicated, in particular all the passive elements which are used as feedback elements for amplifiers. Furthermore, common-note feedback circuits must be added.

SUMMARY

The object of the invention is thus to specify a method which suppresses harmonic distortion caused by non-linear elements. In particular, the method according to the invention should not have the disadvantages (2) and (3) of the conventional method, or should have them only in a lesser form. A further aim of the invention is to provide an apparatus for suppression of harmonic distortion caused by non-linear elements, having the characteristics mentioned above.

This object can be achieved by a method for suppression of even-numbered harmonic distortion which occurs in a non-linear element, comprising the following steps of linking of a signal to a pseudo random noise sequence before it passes through the non-linear element; and linking of the signal to a sequence which is derived from the pseudo random noise sequence, in particular to the same pseudo random noise sequence, after it passes through the non-linear element.

The signal can be spread by the first linking operation, and can be despread by the second linking operation. A digital signal can be linked to the pseudo random noise sequence by multiplying the digital signal by a ±1 sequence corresponding to the pseudo random noise sequence. An analogue signal can be linked to the pseudo random noise sequence by inverting the mathematical sign of the analogue signal in accordance with the pseudo random noise sequence. An analogue signal can be linked to the pseudo random noise sequence by multiplying the analogue signal by a square-wave voltage in accordance with the pseudo random noise sequence. The non-linear element may have an amplifier or a circuit with switched capacitors or switched currents.

The object can also be achieved by an apparatus for suppression of even-numbered harmonic distortion which occurs in a non-linear element comprising a pseudo random noise generator for production of a pseudo random noise sequence, a first logic unit which links the pseudo random noise sequence to a signal and produces an input signal for a non-linear element which receives the input signal produced in the first logic unit and emits an output signal, and a second logic unit, which links the output signal from the non-linear element to a sequence which is derived from the pseudo random noise sequence, in particular the same pseudo random noise sequence.

The signal can be spread in the first logic unit, and can be despread in the second logic unit. The logic units may link the pseudo random noise sequence to a digital signal by multiplication by ±1 sequence in accordance with the pseudo random noise sequence. The logic units may link the pseudo random noise sequence to an analogue signal by inversion of the mathematical sign of the analogue signal corresponding to the pseudo random noise sequence. The logic units may link the pseudo random noise sequence to an analogue signal by multiplication by a square-wave voltage corresponding to the pseudo random noise sequence. The non-linear element may have an amplifier or a circuit with switched capacitors or switched currents.

The method according to the invention for suppression of even-numbered order distortion which occurs in a non-linear element comprises the step of linking a signal to a pseudo random noise signal sequence before it passes through the non-linear element, and of linking the signal to a sequence which is derived from the pseudo random noise sequence, in particular to the same pseudo random noise sequence, after it has passed through the non-linear element.

The linking process in the first step of the method according to the invention results in the signal preferably being spread over a broad bandwidth and in a broadband quasi-white, spectrally uniformly distributed noise signal being produced. The square of the pseudo random noise sequences is produced at each time 1. On passing through a non-linear element, the even-numbered order terms (0, 2nd, 4th, . . . order) in Equation (1) thus exhibit a qualitatively different behaviour to that of the odd-numbered order terms (1st, 3th, 5th, . . . order), thus making it possible to separate the even-numbered order terms from the odd-numbered order terms. In particular, the even-numbered order terms are despread just by passing through the non-linear element, in contrast to the odd-numbered order terms. The linking of the output signal from the non-linear element to the pseudo random noise sequence in the second step of the method according to the invention results in all the odd-numbered order terms, in particular the linear term, being despread, while the even-numbered order terms are spread once again, resulting in a broadband noise signal. The energy in the even-numbered order non-linear terms and, in the case of sinusoidal signals, the energy in the constant offset and in the even-numbered harmonics is spread to form broadband, quasi-white noise, and is thus effectively removed from the output signal. In this case, any signal delays which occur in the non-linear element must be taken into account in the linking process in the second step of the method according to the invention, for correct despreading.

The linking process in the second step of the method according to the invention can be carried out using the same pseudo random noise sequence as has already been used in the first step of the method according to the invention. However, it is also feasible in the second step to use a sequence which has been derived from the previously used pseudo random noise sequence. For example, an inverted version of the pseudo random noise sequence may be used which qualitatively exhibits the same behaviour in the linking process in the second step of the method according to the invention. The resultant output signal is, however, inverted.

The method according to the invention can be used as an alternative to the known differential technique. This avoids the need for two parallel, identical signal processing paths to be formed, thus reducing the number of necessary components, and hence the design costs. Furthermore, the space which is required for the duplicated configuration is saved, and the method complexity for suppression of even-numbered order distortion, and thus the current drawn by the overall circuit, fall.

The method according to the invention may, however, also be used as a supplementary measure in addition to the known differential technique. This makes it possible, for example, to spread any terms or even-numbered harmonics that still remain as a result of a mismatch between the two signal paths into broadband, quasi-white noise. In particular, additional interference signals which occur as a result of differences between the two signal paths and are expressed by non-identical coefficients $a_0, a_2, a_4, \ldots$ in the Equations (3) and (4) can be suppressed.

In one advantageous refinement of the method according to the invention, a digital signal is linked to the pseudo random noise sequence by multiplying the signal by a ±1 sequence corresponding to the pseudo random noise sequence. The frequency of the ±1 sequence may in this case be the same as the data rate, that is to say the clock frequency of the digital signal.

In a further advantageous refinement of the method according to the invention, an analogue signal is linked to the pseudo random noise sequence by inverting the mathematical sign of the analogue signal in accordance with the pseudo random noise sequence.

In a further advantageous refinement, an analogue signal is linked to a pseudo random noise sequence by multiplying the analogue signal by a square-wave voltage corresponding to the pseudo random noise sequence. The square-wave voltage has, in particular, two voltage values of identical magnitudes but with opposite mathematical signs.

BRIEF DESCRIPTION OF THE DRAWINGS

The invention will be explained in more detail in the following text with reference to an exemplary embodiment and in conjunction with the drawing Figures, in which.

DETAILED DESCRIPTION

Figure 1:
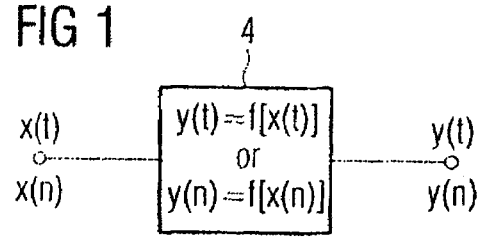
FIG. 1 shows a schematic illustration of a non-linear element.
Figure 2:
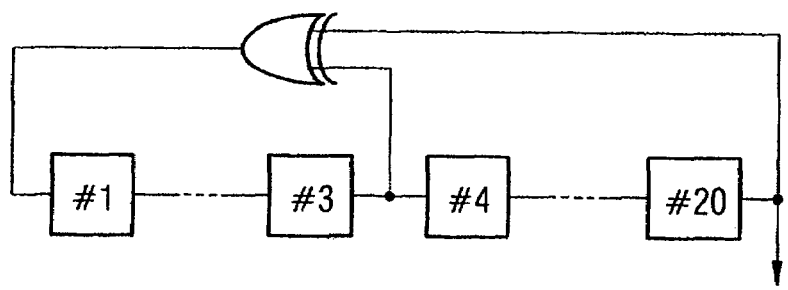
FIG. 2 shows a generator for pseudo random noise sequences.

FIG. 2 shows one exemplary embodiment of a pseudo random noise generator with a shift register with 20 memory cells (for example D-type flipflops) and an XOR gate for feedback. The pseudo random noise sequence is tapped off at the output of the last memory cell #20 in the shift register.

Figure 3:
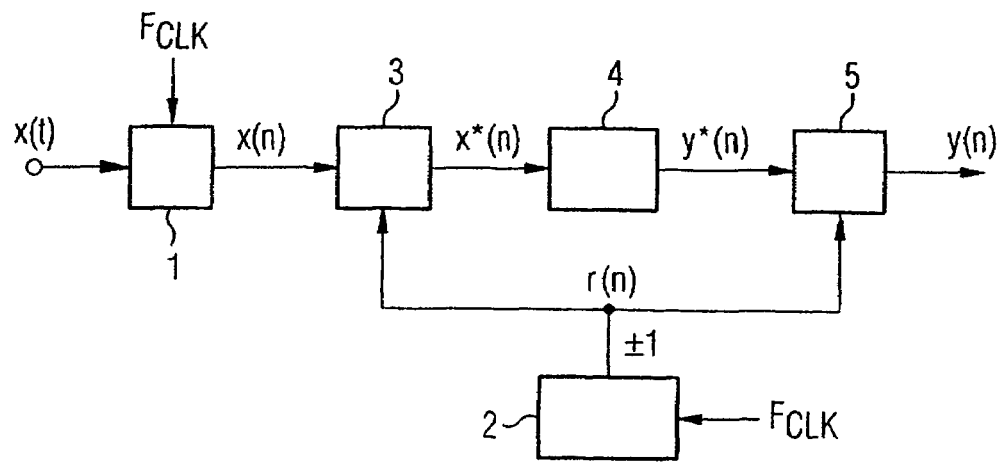
FIG. 3 shows an apparatus for carrying out the method according to the invention.

FIG. 3 shows one exemplary embodiment of an apparatus for carrying out the method according to the invention, based on the example of a sampling circuit, as is used, by way of example, in analogue/digital converters, switched capacitor circuits and switched current circuits. In the present exemplary embodiment, a sampling apparatus 1 samples an analogue signal x(t) at a clock frequency $F_{clk}$, and emits a sampled signal x(n). A pseudo random noise generator 2 produces a pseudo random noise sequence r(n), and emits this in the form of a logical ±1 sequence, whose spectral characteristic corresponds to white noise. The frequency of the pseudo random noise sequence is in this case equal to the sampling rate $F_{clk}$. In the logic unit 3, the pseudo random noise sequence r(n), in the form of the logical ±1 sequence, is multiplied by the digital sampling signal x(n) and produces the input signal x*(n)=x(n)·r(n) for the non-linear element 4.

According to Equation (1), the output signal y*(n) of the non-linear element 4 is:

$$y^*(n) = a_0 + a_1 x^*(n) + a_2 (x^*(n))^2 + a_3 (x^*(n))^3 + a_4 (x^*(n))^4 + a_5 (x^*(n))^5 + \quad (6)$$

Using the above definition for x*(n), this can be written as:

$$y^*(n) = a_0 + a_1 [x(n) \cdot r(n)] + a_2 [x(n) \cdot r(n)]^2 + a_3 [x(n) \cdot r(n)]^3 + a_4 [x(n) \cdot r(n)]^4 + a_5 [x(n) \cdot r(n)]^5 + \quad (7)$$

As mentioned above, pseudo random noise sequences can be described by $r(n)^{2i}=1$ for each integer value of i. Equation (7) can thus be rewritten as:

$$\begin{aligned} y^*(n) &= a_0 + a_1 x(n) \cdot r(n) + a_2 x^2(n) + a_3 x^3(n) \cdot r(n) + a_4 x^4(n) + \\ & \quad a_5 x^5(n) \cdot r(n) + \dots \\ &= r(n) \cdot [a_1 x(n) + a_3 x^3(n) + a_5 x^5(n) + \dots ] + \\ & \quad a_0 + a_2 x^2(n) + a_4 x^4(n) + \dots \end{aligned} \quad (8)$$

The output signal y*(n) from the non-linear element 4 is multiplied by the pseudo random noise sequence r(n) once again in the second logic unit 5, so that the output signal y(n) becomes:

$$\begin{aligned} y(n) &= y^*(n) \cdot r(n) \\ &= a_1 x(n) + a_3 x^3(n) + a_5 x^5(n) + \dots + r(n) \cdot \\ & \quad [a_0 + a_2 x^2(n) + a_4 x^4(n) + \dots ] \\ &= a_1 x(n) + a_3 x^3(n) + a_5 x^5(n) + \dots + \text{broadband noise} \end{aligned} \quad (9)$$

In Equation (9), the constant term and the even-numbered order terms of the output signal y(n) which produce the even-numbered harmonics are multiplied by the pseudo random noise sequence r(n). Their energy is thus spread into broadband, quasi-white noise. Thus, effectively, the output signal y(n) becomes:

$$y(n) = a_1 x(n) + a_3 x^3(n) + a_5 x^5(n) + \dots + \text{broadband noise} \quad (10)$$

The method according to the invention suppresses constant offsets and even-numbered harmonics which occur while passing through a non-linear element. They are spread over broad bandwidth and are thus effectively removed from the signal.

The method according to the invention can likewise be applied to analogue signals. For example, an analogue signal is linked to the pseudo random noise sequence by inverting the mathematical sign of the analogue signal in accordance with the pseudo random noise sequence, or by multiplying the analogue signal by a square-wave voltage in accordance with the pseudo random noise sequence, with this square-wave voltage advantageously having two voltage values with identical magnitudes but opposite mathematical signs.

The method according to the invention for suppression of even-numbered harmonic distortion which occurs in a non-linear element can be applied to all passive and active types of non-linear elements. In particular, the method for suppression of even-numbered harmonic distortion can be used in analogue/digital converters, digital/analogue converters, filters, amplifiers and circuits with switched capacitors or switched currents.

What is claimed is:

1. A method for suppression of even-numbered harmonic distortion which occurs in a non-linear element, comprising the following steps:
   a first linking of a signal to a pseudo random noise sequence before it passes through the non-linear element; and
   a second linking of the signal to a sequence which is derived from the pseudo random noise sequence, in particular to the same pseudo random noise sequence, after it passes through the non-linear element wherein the even number harmonics are suppressed by spreading the even number harmonics over a broad bandwidth in the second linking.

2. A method according to claim 1, wherein the signal is spread by the first linking operation, and is despread by the second linking operation.

3. A method according to claim 1, wherein a digital signal is linked to the pseudo random noise sequence by multiplying the digital signal by a ±1 sequence corresponding to the pseudo random noise sequence.

4. A method according to claim 1, wherein an analogue signal is linked to the pseudo random noise sequence by inverting the mathematical sign of the analogue signal in accordance with the pseudo random noise sequence.

5. A method according to claim 1, wherein an analogue signal is linked to the pseudo random noise sequence by multiplying the analogue signal by a square-wave voltage in accordance with the pseudo random noise sequence.

6. A method according to claim 1, wherein the non-linear element has an amplifier or a circuit with switched capacitors or switched currents.

7. An apparatus for suppression of even-numbered harmonic distortion which occurs in a non-linear element comprising:
   a pseudo random noise generator for production of a pseudo random noise sequence,
   a first logic unit which links the pseudo random noise sequence to a signal and produces an input signal for a non-linear element which receives the input signal produced in the first logic unit and emits an output signal, and
   a second logic unit, which links the output signal from the non-linear element to a sequence which is derived from the pseudo random noise sequence, in particular the same pseudo random noise sequence wherein the even number harmonics are suppressed by spreading the even number harmonics over a broad bandwidth.

8. An apparatus according to claim 7, wherein the signal is spread in the first logic unit, and is despread in the second logic unit.

9. An apparatus according to claim 8, wherein the logic units link the pseudo random noise sequence to a digital signal by multiplication by ±1 sequence in accordance with the pseudo random noise sequence.

10. An apparatus according to claim 8, wherein the logic units link the pseudo random noise sequence to an analogue signal by inversion of the mathematical sign of the analogue signal corresponding to the pseudo random noise sequence.

11. An apparatus according to claim 8, wherein the logic units link the pseudo random noise sequence to an analogue signal by multiplication by a square-wave voltage corresponding to the pseudo random noise sequence.

12. An apparatus according to claim 7, wherein the logic units link the pseudo random noise sequence to a digital signal by multiplication by ±1 sequence in accordance with the pseudo random noise sequence.

13. An apparatus according to claim 7, wherein the logic units link the pseudo random noise sequence to an analogue signal by inversion of the mathematical sign of the analogue signal corresponding to the pseudo random noise sequence.

14. An apparatus according to claim 7, wherein the logic units link the pseudo random noise sequence to an analogue signal by multiplication by a square-wave voltage corresponding to the pseudo random noise sequence.

15. An apparatus according to claim 7, wherein the non-linear element has an amplifier or a circuit with switched capacitors or switched currents.

16. A method for suppression of even-numbered harmonic distortion which occurs in a non-linear element, comprising the following steps:
linking of a signal to a pseudo random noise sequence before it passes through the non-linear element; and
linking of the signal to a sequence which is derived from the pseudo random noise sequence, in particular to the same pseudo random noise sequence, after it passes through the non-linear element, wherein the signal is spread by the first linking operation, and is despread by the second linking operation.

17. A method according to claim 16, wherein a digital signal is linked to the pseudo random noise sequence by multiplying the digital signal by a ±1 sequence corresponding to the pseudo random noise sequence.

18. A method according to claim 16, wherein an analogue signal is linked to the pseudo random noise sequence by inverting the mathematical sign of the analogue signal in accordance with the pseudo random noise sequence.

19. A method according to claim 16, wherein an analogue signal is linked to the pseudo random noise sequence by multiplying the analogue signal by a square-wave voltage in accordance with the pseudo random noise sequence.

20. A method according to claim 16, wherein the non-linear element has an amplifier or a circuit with switched capacitors or switched currents.

* * * * *